(12) United States Patent
Dohn et al.

(10) Patent No.: US 9,730,309 B2
(45) Date of Patent: Aug. 8, 2017

(54) CERAMIC PRINTED CIRCUIT BOARD COMPRISING AN AL COOLING BODY

(75) Inventors: Alexander Dohn, Memmelsdorf (DE); Alfred Thimm, Wunsiedel (DE)

(73) Assignee: CERAMTEC GmbH, Plochingen (DE)

( * ) Notice: Subject to any disclaimer, the term of this patent is extended or adjusted under 35 U.S.C. 154(b) by 214 days.

(21) Appl. No.: 14/008,867

(22) PCT Filed: Mar. 30, 2012

(86) PCT No.: PCT/EP2012/055746
§ 371 (c)(1),
(2), (4) Date: Sep. 30, 2013

(87) PCT Pub. No.: WO2012/136579
PCT Pub. Date: Oct. 11, 2012

(65) Prior Publication Data
US 2014/0016330 A1  Jan. 16, 2014

(30) Foreign Application Priority Data
Apr. 4, 2011 (DE) .......... 10 2011 006 726

(51) Int. Cl.
*H05K 1/02* (2006.01)
*F21V 29/508* (2015.01)
(Continued)

(52) U.S. Cl.
CPC ......... *H05K 1/0201* (2013.01); *F21V 29/508* (2015.01); *F21V 29/80* (2015.01);
(Continued)

(58) Field of Classification Search
CPC .. H05K 7/2039; H05K 7/20418; H05K 7/205; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181;
(Continued)

(56) References Cited

U.S. PATENT DOCUMENTS 3,561,110 A * 2/1971 Fuelner ................. H05K 3/102
156/89.16
5,299,090 A 3/1994 Brady et al.
(Continued)

FOREIGN PATENT DOCUMENTS

WO  2007/107601 A2  9/2007

OTHER PUBLICATIONS

EP 0889522 English Translation.*

*Primary Examiner* — Pete Lee
(74) *Attorney, Agent, or Firm* — Norton Rose Fulbright US LLP; James Crawford

(57) ABSTRACT

The invention relates to a ceramic printed circuit board comprising an upper side and a lower side, sintered metallization regions being arranged on the upper side, and the lower side being embodied as a cooling body. In order to improve the heat dissipation of components on the upper side of the printed circuit board, the lower side is also provided with sintered metallization regions to which a metal cooling body is soldered.

17 Claims, 1 Drawing Sheet

Figure 1:
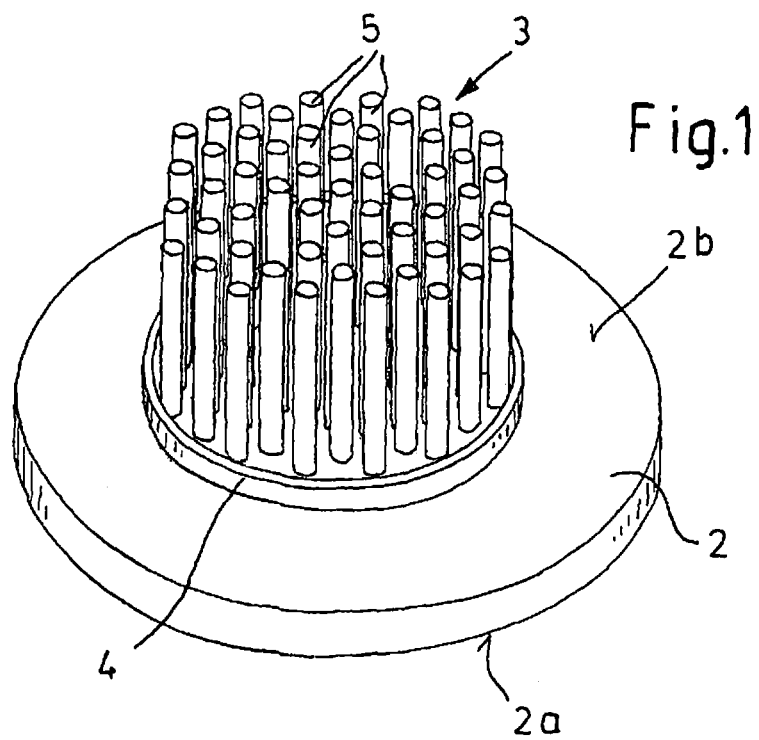

(51) Int. Cl.
*F21V 29/89* (2015.01)
*H01L 23/367* (2006.01)
*H01L 23/373* (2006.01)
*H05K 3/00* (2006.01)
*F21V 29/80* (2015.01)
*F21V 29/85* (2015.01)
*H01L 33/64* (2010.01)
*H05K 1/03* (2006.01)
*F21Y 115/10* (2016.01)

(52) U.S. Cl.
CPC .............. *F21V 29/86* (2015.01); *F21V 29/89* (2015.01); *H01L 23/3677* (2013.01); *H01L 23/3735* (2013.01); *H05K 1/0203* (2013.01); *H05K 3/0061* (2013.01); *F21Y 2115/10* (2016.08); *H01L 33/642* (2013.01); *H01L 2924/0002* (2013.01); *H05K 1/0306* (2013.01); *H05K 2201/10106* (2013.01)

(58) Field of Classification Search
CPC ........ H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 2201/0129; H05K 2201/0195; H05K 2201/023; H05K 2201/0239; H05K 3/321; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H05K 2201/09509; H05K 2201/09518; H05K 2201/09527; H05K 2201/09536; H05K 2201/09545; H05K 2201/09554; H05K 2201/09581; H05K 2201/096; H05K 2201/09609; H05K 2201/09618; H05K 2201/09627; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 3/4602; F28F 13/00; H01L 23/3677; H01L 23/3735; H01L 33/642; F21V 29/508; F21V 29/89; F21V 29/80; F21V 29/86; F21Y 2115/10
USPC .................. 361/720, 719; 362/294, 373, 264
See application file for complete search history.

(56) References Cited

U.S. PATENT DOCUMENTS

| 6,003,586 | A | 12/1999 | Beane | |
| 7,269,017 | B2 * | 9/2007 | Berlin | H01L 23/3677 165/185 |
| 7,521,789 | B1 | 4/2009 | Rinehart et al. | |
| 7,659,551 | B2 * | 2/2010 | Loh | H01L 33/58 257/415 |
| 8,040,676 | B2 | 10/2011 | Kluge | |
| 2002/0176250 | A1 * | 11/2002 | Bohler | F21V 29/74 362/236 |
| 2004/0144561 | A1 | 7/2004 | Osanai et al. | |
| 2004/0208210 | A1 * | 10/2004 | Inoguchi | 372/36 |
| 2004/0234213 | A1 * | 11/2004 | Narayan | G02B 6/4201 385/94 |
| 2008/0080187 | A1 * | 4/2008 | Purinton | F21K 9/00 362/294 |
| 2008/0191231 | A1 * | 8/2008 | Park et al. | 257/98 |
| 2009/0086436 | A1 * | 4/2009 | Kluge | F21S 48/328 361/707 |
| 2010/0060374 | A1 * | 3/2010 | Kishimoto | H01P 1/36 333/24.2 |
| 2010/0193801 | A1 * | 8/2010 | Yamada | B23K 35/282 257/77 |
| 2010/0236819 | A1 * | 9/2010 | Chiang | H05K 3/0029 174/257 |
| 2010/0328947 | A1 | 12/2010 | Chang et al. | |
| 2011/0267801 | A1 * | 11/2011 | Tong et al. | 362/84 |
| 2011/0279981 | A1 * | 11/2011 | Horng et al. | 361/720 |

* cited by examiner

CERAMIC PRINTED CIRCUIT BOARD COMPRISING AN AL COOLING BODY

This application is a §371 of International Application No. PCT/EP2012/055746 filed Mar. 30, 2012, and claims priority from German Patent Application No. 10 2011 006 726.4 filed Apr. 4, 2011.

The invention relates to a ceramic printed circuit board comprising an upper side and a lower side, sintered metallization regions being arranged on the upper side, and the lower side being configured as a cooling body.

Such a ceramic printed circuit board is known from WO 2007/107601 A3.

It is an object of the invention to improve a ceramic printed circuit board according to the preamble of the claim 1 in such a manner that heat the dissipation of components on the upper side of the printed circuit board is improved.

According to the invention, this object is achieved in that sintered metallization regions, onto which a metallic cooling body is soldered, are also arranged on the lower side. By means of the sintered metallization regions on the lower side and by soldering on the metallic cooling body, particularly good heat dissipation from the upper side of the printed circuit board up into the metallic cooling body is achieved. Preferably, a high-melting brazing solder with a melting point between 450 and 660° C. is used. Metallic cooling bodies exhibit high thermal conductivity.

In one embodiment of the invention, the printed circuit board consists of aluminum oxide or aluminum nitride. Preferably, the printed circuit board is made of aluminum nitride, which has a particularly good thermal conductivity.

In a preferred embodiment, the metallic cooling body consists of aluminum. Aluminum has a high thermal conductivity.

In one embodiment according to the invention, the metallic cooling body consists of a carrier plate having a connection side and an active side, and the cooling body is soldered with the connection side onto the metallization regions of the lower side of the printed circuit board, and has protruding cooling elements on the active side. Due to the protruding cooling elements, the surface of the cooling body is enlarged and is able to better emit the introduced heat.

In one embodiment according to the invention, the protruding cooling elements are a plurality of pins like a type of a pin cushion. Through this, the surface is extremely enlarged within a minimum of space.

In one embodiment of the invention, the upper side of the printed circuit board is concave or convex, so that when using the circuit board as a lamp, light can be focused or scattered.

A method according to the invention for producing a printed circuit board is characterized in that a ceramic substrate is produced that is pre-metallized on both sides by sintered metallization regions, that the metallization regions are metallized with gold, silver, silver alloys, active solder with galvanic coatings such as Ni+Au or with aluminum using thick film technology or alternative methods such as thin film technology or plasma spraying, and subsequently, the cooling body is soldered with its connection side onto the lower side of the printed circuit board, a high-melting brazing solder with a melting point between 450 and 660° C. preferably being used as a solder. By soldering in the mentioned temperature range using a brazing solder, a required firm connection is achieved while obtaining a good heat transfer rate. No clamping, screwing or glueing takes place since this involves shortcomings that are avoided by soldering using a brazing solder.

Preferably, the printed circuit board is used as a lamp or as part of a lamp, and LEDs, optionally with an associated circuit, and/or electrical components being soldered onto the upper side of the printed circuit board.

For protection, the circuit can be covered with an opaque cover.

For controlling the emitted light, single lenses or group lenses can be placed on the LEDs.

The printed circuit board 2 according to the invention (see FIGS. 1 and 2) has an upper side 2a and a lower side 2b, a soldered-on metallic cooling body 3 being arranged on the lower side 2b. An essential feature of the invention is that both the upper side 2a and the lower side 2b are configured as ceramic printed circuit boards 2. This is achieved in that sintered metallization regions are applied onto the upper side 2a and the lower side 2b. Sintered metallization regions are described in WO 2007107601 A2. Components such as LEDs and/or a circuit can be soldered directly onto the upper side 2a or the metallization regions thereof. The advantage of this is, among other things, that due to the high thermal conductivity, the heat produced by the components can be dissipated directly into the ceramic of the printed circuit board 2.

The ceramic substrate, preferably made from AlN, that is pre-metallized on both sides by sintered metallization regions is metallized (base metallization) with gold, silver, silver alloys, active solder with galvanic coatings such as Ni+Au or with aluminum using thick film technology or alternative methods (thin film technology, plasma spraying). Both sides of the substrate can also be coated with different metallization. Preferably, the printed circuit board consists of aluminum nitride because in this case, the thermal conductivity is extremely high.

For reasons of high thermal conductivity, a metallic cooling body 3 of suitable geometry is soldered onto the lower side of the ceramic printed circuit board 2 or the side with the base metallization. The cooling body 3 preferably consists of aluminum (injection molding, casting or the like). The solder preferably is a high-melting brazing solder with a melting point between 450 and 660° C. which firmly connects the printed circuit board 2 via the base metallization thereof and the brazing solder to the metallic cooling body 3. No clamping, screwing or glueing takes place.

The ceramic printed circuit board 2 that has sintered metallization regions on both sides and therefore is a circuit board on both sides, or can be used as such, is preferably flat on one side toward the cooler side, i.e., toward the metallic cooling body 3. On the component side, i.e., on the upper side 2a where preferably LEDs 6 are arranged, the surface can also be curved convexly or concavely. Through this, if the components are LEDs 6, the light is emitted in a scattered or bundled manner.

The brazing solder used for soldering on the metallic cooling body 3 preferably is a commercially available aluminum brazing solder (TMP aluminum soldering paste 39) as it is used for repairing aluminum components, which, at 570° C. on a heating plate or in a suitable soldering furnace, is firmly connected with good thermal conductivity (above 50 W/mK) to an inexpensive (oxide-free) aluminum cooler 3 that is thoroughly cleaned mechanically or chemically on the mounting side, i.e., the lower side 2b.

The electrical components such as diodes, LEDs 6, transistors or the like, together with potentially required further components such as resistors or drivers, are then soldered in a second step with a soft solder in the temperature range of preferably 100-400° C. onto the upper side 2A of the pre-metallized ceramic printed circuit board 2. This provides for good transfer in particular for power components.

The connection to the electrical network is preferably carried out through connector strips on the upper side 2a of the ceramic, or via bond wires from the ceramic to the outside. In the case of soldered-on LEDs 6, single lenses or group lenses can be glued on or soldered on for protection or for light scattering. Also, opaque covers can serve for sealing the circuit.

The ceramic printed circuit board according to the invention can be used as a lamp or as part of a lamp.

FIG. 1 shows a printed circuit board 2 with its upper side 2a and lower side 2b. On the lower side 2a, a metallic cooling body 3 from aluminum is soldered on. The ceramic of the printed circuit board 2 is aluminum nitride. In this example, the printed circuit board 2 has a round shape. The sintered metallization regions are not visible in this Figure. The metallic cooling body 3 consists of aluminum and is configured like a pin cushion, i.e., it consists of a carrier plate 4 that is soldered onto the ceramic printed circuit board 2. On the opposite side, a multiplicity of protruding cylindrical pins 5 is arranged on the carrier plate 4.

Figure 2:
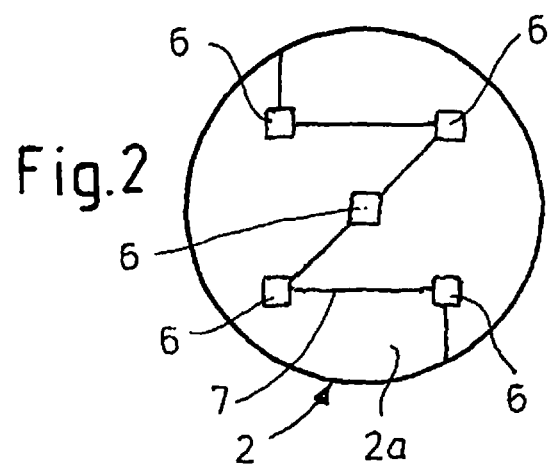

FIG. 2 shows the upper side 2a of the printed circuit board 2 according to FIG. 1. The soldered-on electrical components are designated by the reference number 6. The current lines are applied using thick film technology and are designated by the reference number 7. These current lines 7 and the components 6 are soldered onto the sintered metallization regions. The metallization regions are not shown in the Figure.

It is claimed:

1. A ceramic printed circuit board comprising: an upper side; a lower side; a metallic cooling body; sintered metallization regions arranged on and sintered to the upper side; and additional sintered metallization regions arranged on and sintered to the lower side; wherein the lower side is configured as a cooling body, wherein the metallic cooling body is soldered to the additional sintered metallization regions arranged on the lower side; a ceramic substrate that is pre-metallized on both sides by sintered metallization regions: wherein the metallization regions are metallized with gold, silver, a silver alloy, an active solder with a galvanic coating such as Ni+Au or with aluminum using a thick film technology, a thin film technology or a plasma spraying process; subsequently soldering the cooling body with its connection side onto the lower side of the printed circuit board; and wherein a high-melting brazing solder with a melting point between 450 and 660° C. is used as a solder.

2. The printed circuit board according to claim 1, wherein the printed circuit board comprises at least one member selected from the group consisting of aluminum oxide and aluminum nitride.

3. The printed circuit board according to claim 1, wherein the metallic cooling body comprises aluminum.

4. The printed circuit board according to claim 1, wherein the metallic cooling body comprises a carrier plate having a connection side and an active side; wherein the cooling body is soldered with the connection side onto the sintered metallization regions of the lower side of the printed circuit board, and comprises protruding cooling elements on the active side.

5. The printed circuit board according to claim 4, wherein the protruding cooling elements are a plurality of pins.

6. The method according to claim 1, wherein a single lens or a group of lenses are placed onto a light emitting diode on the printed circuit board.

7. A lamp comprising a printed circuit board according to claim 1 and a light emitting diode.

8. The lamp according to claim 6, wherein the printed circuit board has a printed circuit that is covered with an opaque cover.

9. The printed circuit board according to claim 2, wherein the metallic cooling body comprises a carrier plate having a connection side and an active side; wherein the cooling body is soldered with the connection side onto the metallization regions of the lower side of the printed circuit board, and comprises protruding cooling elements on the active side.

10. The printed circuit board according to claim 9, wherein the protruding cooling elements are a plurality of pins.

11. The printed circuit board according to claim 3, wherein the metallic cooling body comprises a carrier plate having a connection side and an active side; wherein the cooling body is soldered with the connection side onto the metallization regions of the lower side of the printed circuit board, and comprises protruding cooling elements on the active side.

12. The printed circuit board according to claim 11, wherein the protruding cooling elements are a plurality of pins.

13. The printed circuit board according to claim 3, wherein the upper side of the printed circuit board is formed concavely or convexly.

14. The method according to claim 2, wherein a single lens or a group of lenses are placed onto a light emitting diode on the printed circuit board.

15. The method according to claim 1, wherein a single lens or a group of lenses are placed onto a light emitting diode on the printed circuit board.

16. A lamp according to claim 7, wherein a single lens is placed onto the light emitting diode.

17. A lamp according to claim 7, wherein a group of lenses are placed onto the light emitting diode.

* * * * *